United States Patent [19]
Maloney et al.

[11] Patent Number: 5,907,464
[45] Date of Patent: May 25, 1999

[54] MOSFET-BASED POWER SUPPLY CLAMPS FOR ELECTROSTATIC DISCHARGE PROTECTION OF INTEGRATED CIRCUITS

[75] Inventors: Timothy J. Maloney, Palo Alto; Travis M. Eiles, San Jose, both of Calif.

[73] Assignee: Intel Corporation, Santa Clara, Calif.

[21] Appl. No.: 08/823,109

[22] Filed: Mar. 24, 1997

[51] Int. Cl.⁶ .................................................. H02H 3/00
[52] U.S. Cl. .............................. 361/111; 361/56; 361/58; 361/118
[58] Field of Search ................................ 361/56, 91, 111, 361/58, 115, 117, 118, 119, 127

[56] References Cited

U.S. PATENT DOCUMENTS

| | | | |
|---|---|---|---|
| 5,400,202 | 3/1995 | Metz et al. ................................. | 361/56 |
| 5,530,612 | 6/1996 | Maloney ................................... | 361/56 |
| 5,543,650 | 8/1996 | Au et al. .................................. | 257/355 |
| 5,654,862 | 8/1997 | Worley et al. ........................... | 361/111 |

OTHER PUBLICATIONS

E.R. Worley et al, Rockwell Telecommunications; *Sub-Micron Chip ESD Protection Schemes Which Avoid Avalanching Junctions*; EOS/ESD Symposium 95–13–95–20; pp. 1.2.1–1.2.8.

Merrill, Issaq, National Semiconductor Fairchild Research Center; *ESD Design Methodology*; EOS/ESD Symposium 93–233–93–237; pp. 5B.5.1–5B.5.5.

*Primary Examiner*—Jeffrey Gaffin
*Assistant Examiner*—Stephen Jackson
*Attorney, Agent, or Firm*—Blakely, Sokoloff, Taylor & Zafman

[57] ABSTRACT

Electrostatic discharge protection circuits adapted for use in low voltage CMOS processes have at least one PFET in the primary charge conduction path, and timer circuits configured to enable the primary conduction path during ESD events and to disable the primary conduction path during steady state conditions.

In a further aspect of the present invention, bias circuits for maintaining steady state gate voltages below the dielectric breakdown level are included.

In a still further aspect of the present invention a bridge circuit couples a first power supply node to a second power supply node, where the second power supply node is coupled to an ESD protection circuit.

22 Claims, 7 Drawing Sheets

MOSFET-BASED POWER SUPPLY CLAMPS FOR ELECTROSTATIC DISCHARGE PROTECTION OF INTEGRATED CIRCUITS

BACKGROUND OF THE INVENTION

1. Field of the Invention

The present invention relates generally to electrostatic discharge (ESD) protection for integrated circuits, and more particularly to clamp circuits having p-channel field effect transistors as the primary current carrying elements.

2. Background

Figure 1:
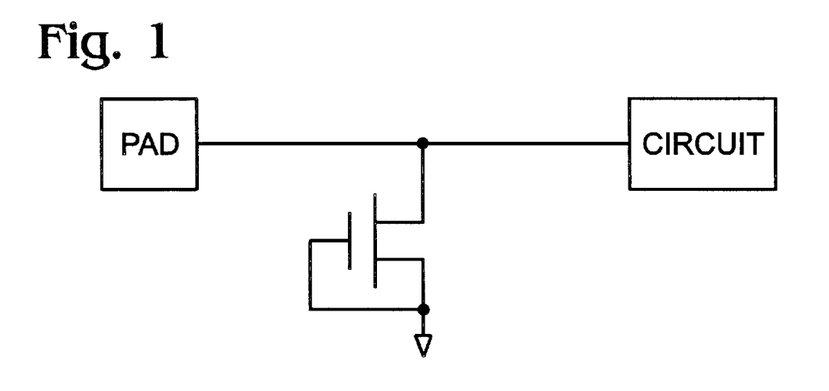
FIG. 1 is a schematic of a very simple ESD input protection circuit.

As is well known, the build up of static charge may lead to extremely high voltage developed near an integrated circuit (IC). Electrostatic discharge (ESD) refers to the phenomenon of the electrical discharge of high current for short duration resulting from the build up of static charge on a particular IC package, or on a nearby human handling that particular IC package. ESD is a serious problem for semiconductor devices since it has the potential to destroy an entire IC. Since ESD events occur often across the silicon circuits attached to the package terminals, circuit designers have concentrated their efforts on developing adequate protection mechanisms for these sensitive circuits. FIG. 1 shows a simple, well-known ESD input protection circuit, wherein a grounded gate NFET has a drain junction breakdown voltage lower than the gate dielectric breakdown voltage.

Ideally, an ESD protection circuit should be able to protect an IC against any conceivable static discharge by non-destructively passing large currents through a low impedance path in a short time.

One difficulty in designing ESD protection circuits is the demanding performance requirements that must be met. For example, one of the primary industry standards for measuring ESD robustness (MIL-STD-883C method 3015.7 Notice 8 (1989), and its follow-on Human Body Model (HBM) standard No. 5.1 (1993) from the EOS/ESD Association) requires ESD zapping for what can be a large number of pin and power supply combinations. In the past ESD protection circuits have had difficulty meeting these stringent requirements while maintaining adequate noise immunity.

ICs have come under pressure in HBM tests because of repeated stressing of the power supply rails, leading to wearout of various breakdown points, such as the Vcc lines. A reliable power supply clamp is needed to reduce the susceptibility of the Vcc bus to failure mechanisms related to ESD testing. ESD protection of input and output pins becomes simpler with a reliable power supply clamp because ESD current can be routed to one supply or another through forward-biased diodes, regardless of polarity.

The physical dimensions of circuit elements in integrated circuits such as microprocessors are becoming smaller with each new generation of semiconductor manufacturing processes. Although these smaller dimensions aid in increasing the operating speed of ICs, an adverse impact of reducing dimensions is the increased sensitivity of circuit elements such as FETs, and more particularly the thin gate insulator layers of FETs, to high electric fields. One technique used to overcome this increased sensitivity is to reduce the operating voltage of an IC. However to maintain compatibility with previous generations of semiconductor products, it has been necessary to provide ICs with interface circuits that are interoperable with older generation ICs that operate at higher voltages. This has resulted in the practice of designing ICs having a core that operates from a first power supply voltage, and Input/Output (I/O) circuitry, typically around the physical periphery of an IC, which operates from a higher power supply voltage.

Diode strings have been used successfully to couple peripheral power supplies to their corresponding core power supplies during ESD events, while affording voltage isolation adequate to prevent unwanted coupling during ordinary operation. In their role as charge couplers, they have enhanced charged device model (CDM) performance. Observations indicate that power supply clamps help ICs with multiple, electrically separated power supplies to pass the multiple pin combination tests of the HBM ESD test, which is the most commonly used test in the industry. Further observations indicate that chips with multiple, electrically separated power supplies that do not incorporate power supply clamps have had difficulty passing the HBM pin combination tests.

Figure 2:
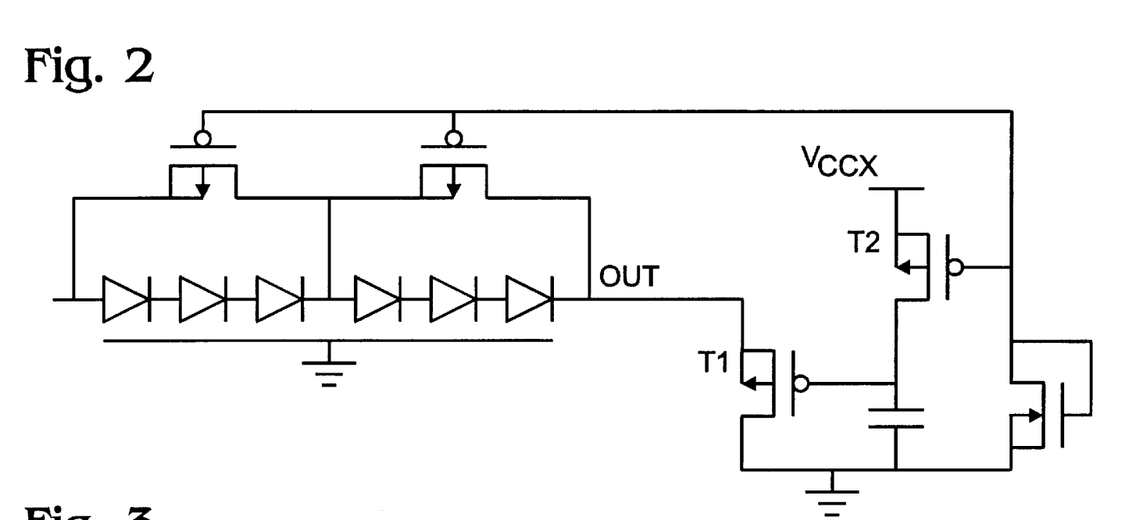
FIG. 2 is a schematic diagram of a six-stage cantilevered diode clamp.
Figure 3:
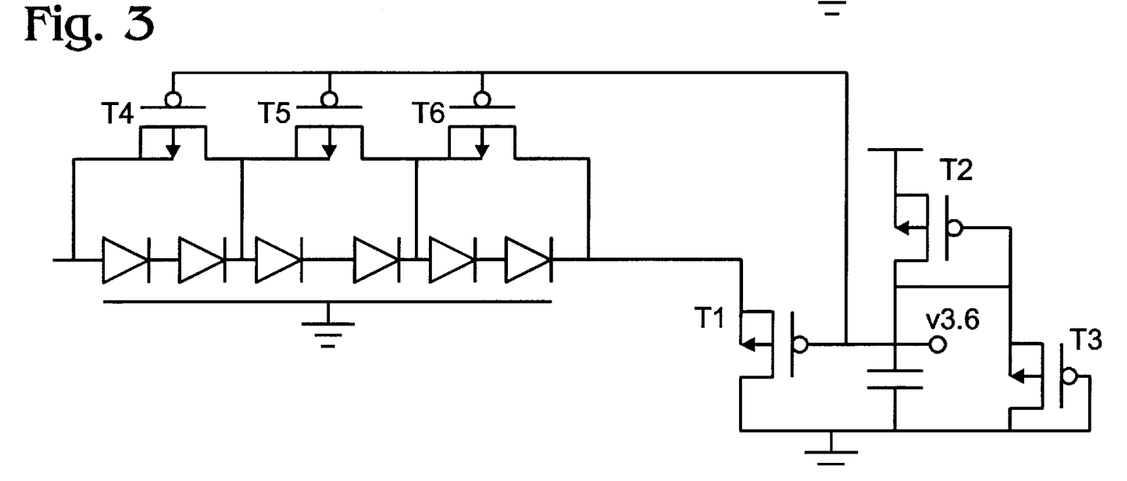
FIG. 3 is schematic diagram of a voltage-tolerant cantilever power supply clamp.
Figure 4:
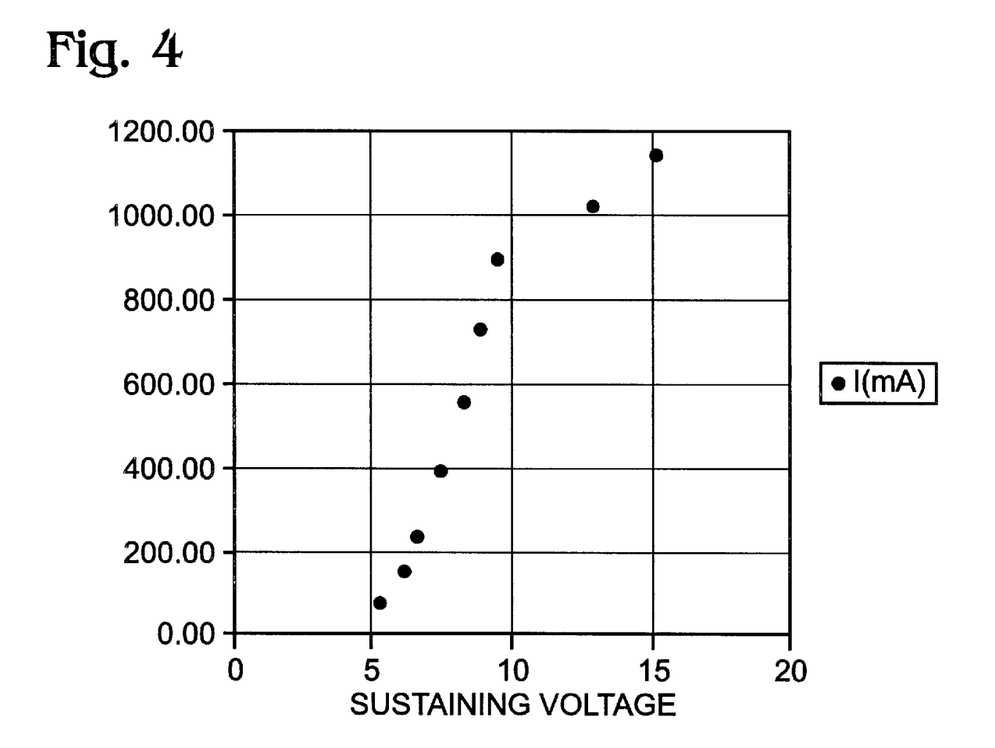
FIG. 4 is graph showing a pulsed I-V curve indicative of the performance of the circuits shown in FIGS. 2 and 3.

Cantilever diode power supply clamps depend on multiple forward diode drops to achieve their functionality. FIGS. 2 and 3 show cantilevered diode power supply clamps and FIG. 4 shows a pulsed I-V curve indicating the performance of the circuits of FIGS. 2 and 3.

In creating low voltage CMOS processes, the FET gate insulator and corresponding insulator and junction breakdown voltages scale downward. Therefore a cantilever diode string of sufficient length to achieve ESD protection functionality would be too long for clamping on-chip power supplies because the number of forward diode drops needed for heavy current conduction (as seen in FIG. 4) does not scale along with other CMOS physical and electrical parameters.

What is needed is power supply clamping and improved coupling of the charge to safe discharge paths.

What is further needed is an area-efficient ESD protection circuit adapted for low voltage Complementary Metal Oxide Semiconductor (CMOS) processes.

What is further needed is an efficient ESD protection device for higher than core voltage power supplies on CMOS processes, where the total supply voltage must be dropped across two gate oxides instead of one for reasons of reliability.

SUMMARY OF THE INVENTION

Briefly, electrostatic discharge protection circuits adapted for use in low voltage CMOS processes have at least one PFET in the primary charge conduction path, and timer circuits configured to enable the primary conduction path during ESD events and to disable the primary conduction path during steady state conditions.

In a further aspect of the present invention, bias circuits for maintaining steady state gate voltages below the gate dielectric breakdown level are included.

In a still further aspect of the present invention a bridge circuit couples a first power supply node to a second power supply node, where the second power supply node is coupled to an ESD protection circuit.

DETAILED DESCRIPTION

Terminology

Cantilever refers to a diode chain with power supply anchorage at only one end, and self-terminated at the other end.

Gate dielectric refers to the insulating material disposed between the gate and the channel of a FET. Typically the gate dielectric is an oxide of silicon, but other materials well known in this field may be used to produce the gate dielectric layer. In the semiconductor industry, the gate dielectric layer is sometimes referred to as the gate insulator, gate oxide, thin oxide, or similar terms.

The terms, chip, integrated circuit, monolithic device, semiconductor device, and microelectronic device, are often used interchangeably in this field. The present invention is applicable to all of the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al) or an alloy of Al and copper (Cu), are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The term power bus(es) as used herein refers collectively to conductors that connect circuitry, substrate or wells to voltage supplies such as Vdd, Vcc, Vss, ground or any other voltage supply used by the chip.

FETs are four terminal devices having gate, drain, source, and body terminals. This body, or bulk terminal can sometimes be a substrate connection, where the substrate is the base semiconductor on which the integrated circuit is built. In the field of CMOS semiconductor technology, the body connection referred to above, is typically made to the well in which a FET is formed, e.g., an n-well for a PFET, and a p-well for an NFET. In a CMOS process having only one well type, for example n-wells, the PFET body terminal is connected to an n-well, and the NFET body terminal is connected to the bulk, or substrate, of the semiconductor material. As used herein, the terms substrate and n-well, refer to the bulk or body connection of NFETs and PFETs respectively. Although the illustrative examples below refer to n-well CMOS, it will be understood that the present invention is applicable to p-well CMOS as well as silicon-on-insulator technologies.

Inverting circuit stage refers to a circuit that accepts at least one input signal and produces at least one output signal wherein the at least one output signal transitions from a first state to a second state in response to a first transition of the at least one input signal, and wherein the output signal transitions from the second state to the first state in response to a second transition of the input signal. Examples of inverting circuit stages include, but are not limited to, inverters, NAND gates, and NOR gates.

Stand alone clamp refers to a power supply protection circuit that routes charge from an ESD event to the substrate rather than to another power supply node.

Overview

Cantilever diode power supply clamps depend on multiple forward diode voltage drops and P-N-P current gain. For more advanced low voltage processes, the basic P-N-P current gain is lower than in previous process generations, while the diode voltage drop has not scaled down with shrinking process dimensions. The result is that performance of cantilever diode clamps becomes unacceptable.

New circuit configurations in accordance with the present invention use area efficient PFETs to conduct current generated during an ESD event, and provide biasing so as to avoid over-stressing gate dielectric layers.

Figure 5:
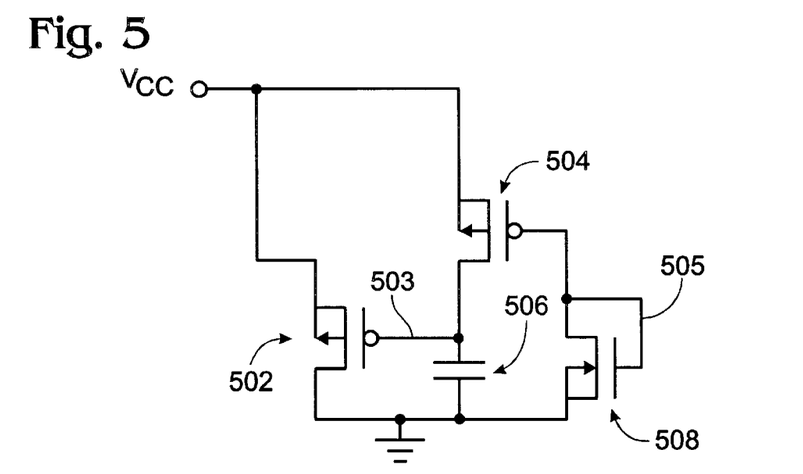
FIG. 5 is a schematic diagram of an RC-timed PFET power supply clamp.

FIG. 5 is schematic diagram of a simplified version of a PMOS power supply clamp, showing only the PFET current discharge path and the RC timer. More particularly, a PFET 502, for conducting the bulk of the charge resulting from an ESD event, is coupled source-to-drain between a power supply node and ground. An RC timer is formed from a long-channel PFET 504 coupled source-to-drain between the power supply node and a node 503; a capacitor 506 coupled between node 503 and ground; and an NFET 508 coupled drain-to-source between the gate terminal of PFET 504 and ground. The gate terminal of NFET 508 is coupled to its drain. A node 505 is formed from the gate and drain terminals of NFET 508 and the gate terminal of PFET 504. Those skilled in the art will recognize that NFET 508 holds its drain, node 505, at approximately a threshold voltage Vt above ground and is intended to block an ESD event from Vcc to ground through the single gate oxide of PFET 504, while establishing substantially a ground reference for the gate of PFET 504. NFET 508 and equivalent devices described herein, could possibly be replaced by a series resistor. The RC timer output node 503 is coupled to the gate terminal of PFET 502.

It can be seen from the simplified circuit shown in FIG. 5 that during ESD testing PFET 502 will initially conduct and then turn off as the RC timer charges node 503 to the point where the gate to source voltage of PFET 502 is below the threshold voltage of that transistor. The size of PFET 504 and capacitor 506 are chosen such that PFET 502 will be on for a period of time long enough to conduct charge during an ESD event, yet be turned off under normal operating conditions.

Figure 6:
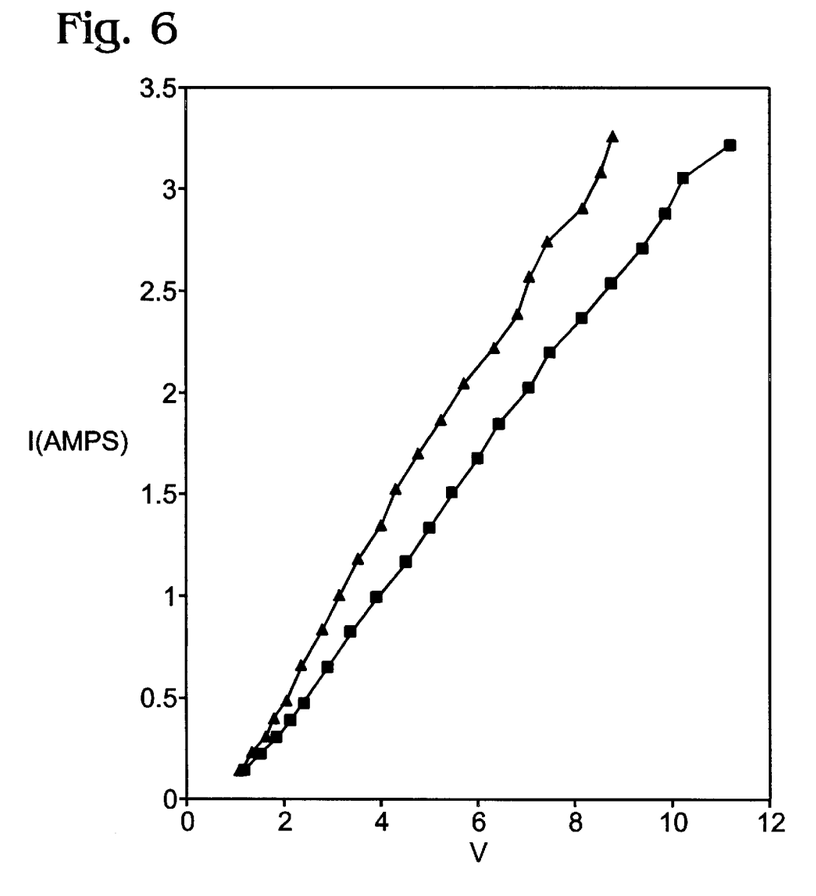
FIG. 6 is graph showing a pulsed I-V curve indicative of the performance of the circuits of the present invention.

FIG. 6 shows the I-V curves of both a PMOS power supply clamp having the gate of the main charge carrying PFET grounded (triangle data points) and a PMOS power supply clamp in accordance with the present invention having a non-zero bias voltage temporarily applied to the gate of the main charge carrying PFET. This curve indicates that very good ESD protection performance is achieved with the biased gate PFET circuit despite the capacitive coupling from PFET gate to source which tends to turn off the PFET.

PMOS Clamp

Figure 7A:
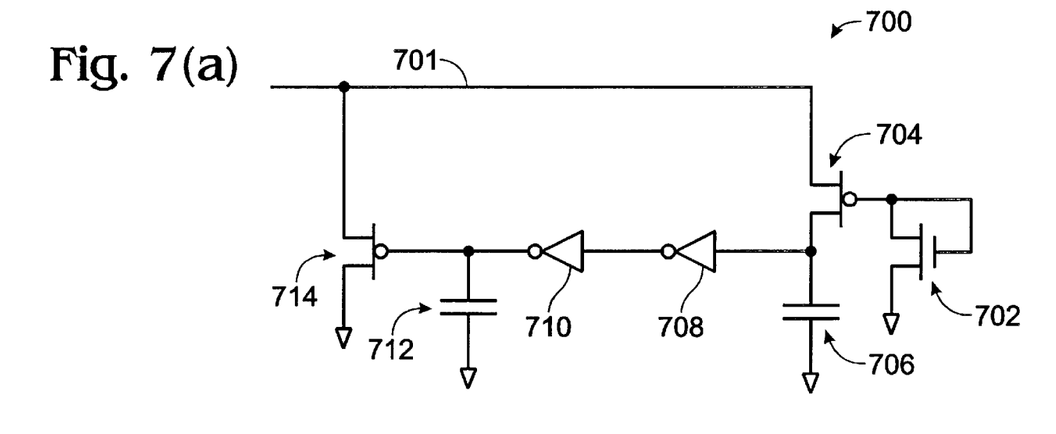
FIG. 7(a) is a simplified schematic diagram of an improved RC-timed PFET power supply clamp in accordance with the present invention.
Figure 7B:
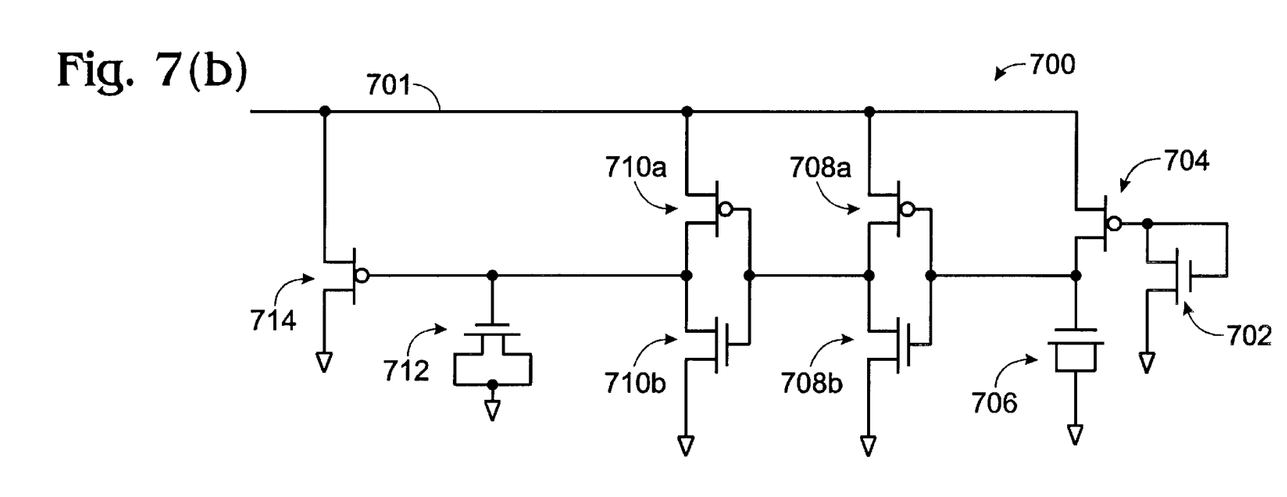
FIG. 7(b) is a transistor-level schematic diagram of an improved RC-timed PFET power supply clamp in accordance with the present invention.

Referring to FIGS. 7(a) and (b), an improved RC-timed PFET power supply clamp 700 in accordance with the present invention is described. Power supply clamp 700 differs from the RC-timed PFET power supply shown in FIG. 6, in that it has been enhanced through the addition of a two stage string of inverters and an extra capacitor. The RC timer is configured such that the input to the first inverting stage starts low and then transitions high for steady state operation. Power supply clamp 700 has an NFET 702 with its source terminal coupled to ground, and its gate and drain terminals coupled to the gate terminal of a PFET 704. NFET 702 acts to keep the gate of PFET 704 at approximately a threshold voltage above ground. PFET 704 is a long channel device intended to act substantially as a resistor. The source terminal of PFET 704 is coupled to power supply node 701. The drain of PFET 704 is coupled to one terminal of a capacitor 706, and to the input terminal of an inverter 708. The second terminal of capacitor 706 is coupled to ground. The output terminal of inverter 708 is coupled to the input terminal of an inverter 710. The output terminal of inverter 710 is coupled to one terminal of a capacitor 712, and to the gate terminal of a PFET 714. The second terminal of capacitor 712 is coupled to ground. The source terminal of PFET 714 is coupled to power supply node 701, and the drain terminal of PFET 714 is coupled to ground. In a typical embodiment, PFET 714 has a gate width of several thousand microns to pass the current arising from an ESD event.

Further circuit configuration details of this illustrative embodiment can be seen with reference to FIG. 7(b). More particularly, FIG. 7(b) shows that each of capacitors 706, 712, may be implemented as an NFET with the gate acting as one terminal of the capacitor and the source and drain terminal together forming the second terminal of the capacitor. Inverter 708 may be implemented as a PFET 708a and an NFET 708b coupled in series between power supply node 701 and ground. Similarly, inverter 710 may be implemented as a PFET 710a and an NFET 710b coupled in series between power supply node 701 and ground. In this illustrative embodiment, all the NFET substrate terminals are coupled to ground, and all the PFET n-well terminals are coupled to power supply node 701.

Inverter 708 is ratioed so that its trip point, Vtrip, is about midway between power supply node 701 and ground. This allows enough voltage for the RC timer to operate comfortably, turning off PFET 714 after a time on the order of microseconds. However, there is also enough voltage between power supply node 701 and Vtrip that ordinary noise spikes on power supply node 701 will not turn on power supply clamp 700.

Inverter 710 is sized such that the ratio of its NFET to PFET size is much larger than the ratio of NFET to PFET size in inverter 708. In a typical embodiment of the present invention the NFET to PFET ratio in inverter 708 is about one, and the NFET to PFET ratio in inverter 710 is about three. Using an NFET to provide the low level drive to the gate of the large PFET allows the PFET to be strongly turned on. In the illustrative embodiment shown in FIGS. 7(a) and 7(b), inverter 710 is followed by a capacitor 712 coupled between the output of inverter 710 and ground, so that the gate of PFET 714 will stay closer to ground when it is intended to be on, thus improving ESD protection performance. Together inverters 708, 710 and capacitor 712 form a discharge path control circuit.

Capacitor 712 is typically implemented as a FET configured as a two terminal device. In the illustrative embodiment capacitor 712 is implemented with an NFET.

Satisfactory ESD performance can also be obtained without the capacitor coupled to the output of inverter 710, simply by sizing inverter 710 such that a good low level is maintained on the gate of PFET 714 when PFET 714 is intended to be conducting. In this case the discharge path control circuit is formed from inverters 708, 710.

Those skilled in the art will recognize that inverting circuit stages other than the inverters shown may be used to implement the discharge path control circuit shown in FIGS. 7(a) and (b). Those skilled in the art will further recognize that the discharge path control circuit may be implemented with an odd number of inverting circuit stages by changing the configuration of the RC timer such that the RC timer output is high and then transitions low for steady state operation.

High Voltage PMOS Clamp

As semiconductor manufacturing processes continue to deliver smaller and smaller geometries, a well-known consequence for circuit designers is the need to operate at lower and lower voltages. However, as supply voltages scale down (e.g., from 5.0 volts, to 3.3 volts, to 2.5 volts, to 1.8 volts), a need arises for backward compatibility with the higher voltage requirements of older ICs. A description follows, with reference to FIG. 8, of an ESD protection circuit according to the present invention, for use where supply voltages are too high to be dropped across one thin gate oxide.

Figure 8:
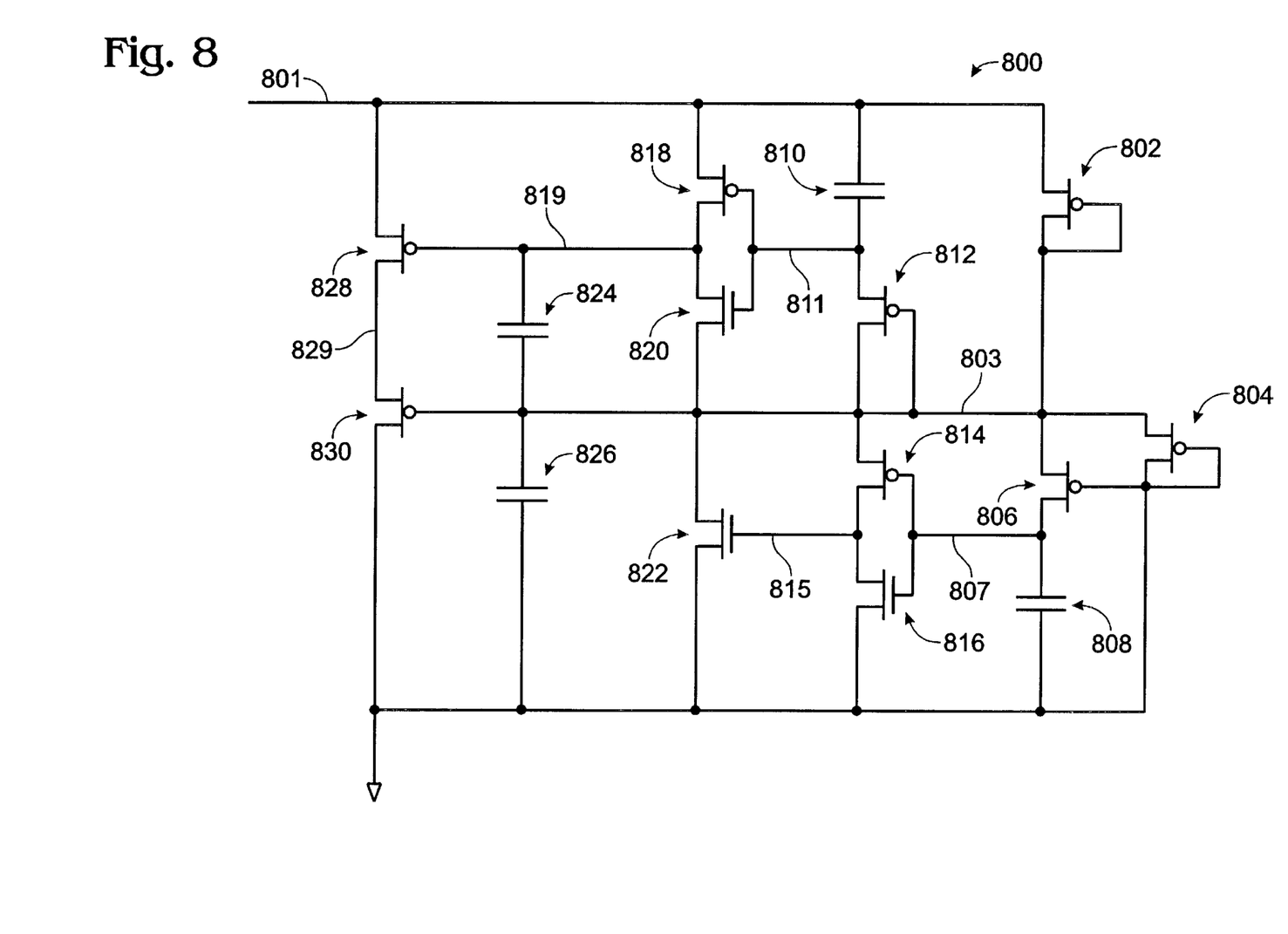
FIG. 8 is a schematic diagram of an area-efficient clamp circuit according to the present invention.

Referring to FIG. 8, an illustrative embodiment of a high voltage PMOS clamp in accordance with the present invention is described. The illustrative embodiment has a long-channel PFET 802 coupled source-to-drain between a power supply node 801 and a node 803. The gate terminal of PFET 802 is electrically connected to node 803. A long-channel PFET 804 is coupled source-to-drain between node 803 and ground. The gate terminal of PFET 804 is electrically connected to ground. PFETs 802 and 804 divide the high voltage into a smaller voltage appropriate for long-term exposure on a single gate oxide. A PFET 806 is coupled source-to-drain between node 803 and one terminal of capacitor 808. The gate terminal of PFET 806 and the second terminal of capacitor 808 are electrically connected to ground. The n-wells of PFETs 814, 806 and 804 are coupled to node 803; and other PFETs shown in FIG. 8 have their n-wells coupled to node 801.

Still referring to FIG. 8, the large PMOS device typical of embodiments of the present invention is implemented here as two series coupled transistors, PFET 828 and PFET 830. Together PFETs 828, 830 form a switchable conductive circuit between two nodes. That is, these two transistors may be switched on to conduct current, or, one or both may be switched off so that substantially no current flows. Those skilled in the art will recognize that some very small current may flow due to leakage or subthreshold conduction mechanisms, but the transistors are still considered to be off. PFETs 828, 830 are laid out to be in the same n-well. In this way, PFETs 828, 830 do not need contacts at their common node, thus allowing minimum spacing between the gate electrodes of the two transistors.

To achieve steady state low leakage current it is only necessary to turn off one of the series coupled PFETs 828, 830. Preferably, the transistor electrically adjacent to power supply node 801 is turned off to achieve the steady state low leakage current. This is accomplished when node 819 is pulled up to substantially the voltage of power supply node 801, through PFET 818. This happens when the voltage at node 811 approaches the voltage at node 803 as RC timer 810–812 settles down.

Initially, capacitors 826, 824 along with NFETs 822, 820 keep the voltages on the gates of PFETs 828, 830 low so that the double gate FET is strongly turned on during an ESD pulse. Long term, RC timer capacitor 808 charges up, through long channel PFET 806, to the steady state voltage of node 803, which is approximately the voltage at node 801 divided by two since a small amount of dc leakage current divides the supply voltage evenly across long-channel PFETs 802, and 804.

PMOS clamps in accordance with the present invention typically have no voltage greater than half that of power supply node 801, dropped across a single gate oxide due to the intermediate voltage at node 803 being a steady state termination point for all subcircuits. Thus the range of over-voltage events affecting oxide reliability in the PMOS clamps is reduced. This makes high voltage PMOS power clamps in accordance with the present invention suitable for backward compatibility over a greater range of voltages than typically achievable in the past.

Bridged PMOS Clamp

In cases where a stand-alone clamp is not required for a high voltage supply, it is possible to clamp that supply to a low voltage core supply with a single PFET and rely on the existing core Vcc clamps to pass the current to ground. This configuration is more area efficient than an equivalent performance double gate PFET clamp as described in the previous section. This bridging clamp is coupled across power supplies like bridging diode strings yet has the advantage of setting into near-zero leakage at dc, and unlike diode strings presents no special requirement of power-up sequencing or supply tracking.

PMOS bridge clamps in accordance with the present invention are described with reference to FIGS. 9 and 10.

Figure 9:
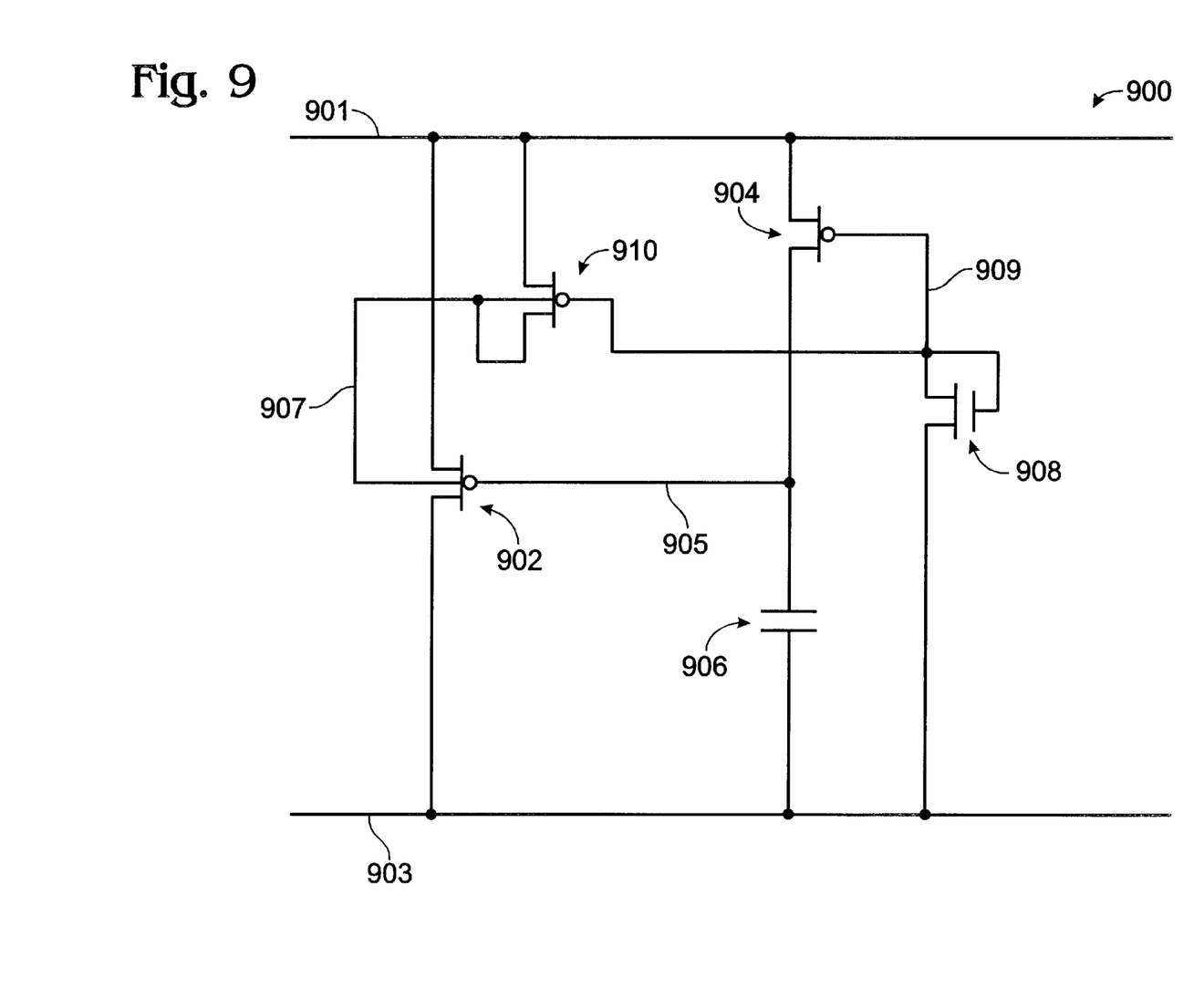
FIG. 9 is a schematic diagram of a bridging clamp circuit.

Referring to FIG. 9, a simplified (i.e., not all leakage paths are handled) PMOS bridge clamp 900 in accordance with the present invention is described. A PFET 902 is coupled source-to-drain between a first power supply node 901 and a second power supply node 903, its gate terminal is coupled to a node 905, and its n-well terminal is coupled to a node 907. A long-channel PFET 904 is coupled source-to-drain between node 901 and node 905, and its gate terminal is coupled to a node 909. A capacitor 906 is coupled between node 905 and node 903. An NFET 908 is coupled drain-to-source between nodes 909 and 903, and its gate terminal is coupled to node 909. A PFET 910 is coupled source-to-drain between nodes 901 and 907, its gate terminal is coupled to node 909, and its n-well terminal is coupled to node 907.

PFET 902 is the large PFET that passes current during an ESD event from node 901 to node 903. The source and drain terminals of PFET 902 act as input/out (I/O) terminals for bridge clamp 900. Typically node 901 is a high voltage power supply node and node 903 is a lower voltage core power supply node. PFET 902 is formed in a floating well, i.e., node 907. Floating well 907 is biased through PFET 910 and in the default case where the voltage at node 901 is greater than the voltage at node 903, the voltage at well 907 follows the voltage at node 901. In the case where the ordering of voltage levels between nodes 901 and 903 is reversed, the voltage supplied from node 901 to well 907 is overridden by forward bias from node 903.

NFET 908 is a small transistor and functions as a bias circuit to ensure that the gates of PFETs 904 and 910 are within approximately a threshold voltage, Vt, of the voltage at node 903. In this manner PFETs 904 and 910 are still strongly conducting so that the gate and n-well of large PFET 902 are pulled to node 901 in the default case of node 901 voltage greater than node 903 voltage.

Long-channel PFET 904 and capacitor 906 form an RC timer for bridge clamp 900. The output terminal of the RC timer is node 905. After a period of time, the voltage on node 905 rises to a value such that PFET 902 turns off, thereby resulting in substantially no conduction through PFET 902.

If an ESD pulse is applied to node 903 rather than node 901, then capacitor 906 tends to connect the gate and source of PFET 902, thus blocking ESD current flow to node 901. This is a desirable result because core supply node 903 is already protected. An additional advantage of this circuit is that if node 903 fails and goes to zero, current from node 901 will only be conducted for the time required by the RC timer to turn off PFET 902 (typically a few microseconds). Although this state cannot be sustained indefinitely because of stress on the gate dielectric layers of the FETs, this failure condition is readily determined since the core voltage supply node has failed and the IC will be unlikely to operate properly.

Features of bridge clamp 900 include the floating n-well that attaches itself to high-voltage node 901 when appropriate, and the connection of the PFET clamp across unequal power supplies to achieve high voltage protection. Note that leakage from node 901 to node 903, and consequently to ground is minimal in steady state when node 901 is the high-voltage node, that is, having a voltage greater than core voltage node 903. This is a better solution with respect to leakage current than the stacked high-voltage clamp 800 shown in FIG. 8 because no internal reference voltage needs to be established with resistive voltage dividers. Thus the externally applied core voltage 903 is fully exploited as a reference point for the gate oxide voltages to high-voltage supply and ground. While steady-state leakage in bridge clamp 900 is minimal for the expected values of voltage for nodes 901 and 903, bridge clamp 900 conducts when the voltage at node 903 exceeds the voltage at node 901, as could be the case during power-up. In that case, PFET 904 forward biases (drain to n-well) taking node 905 to a level such that large PFET 902 turns on, resulting in considerable current from node 903 to node 901 after the influence of capacitor 906 is gone. As described below, bridge clamp 900 may be modified to allow arbitrary, rather than pre-defined power-up conditions without concern for massive current flows lasting longer than a built-in RC time constant.

Figure 10:
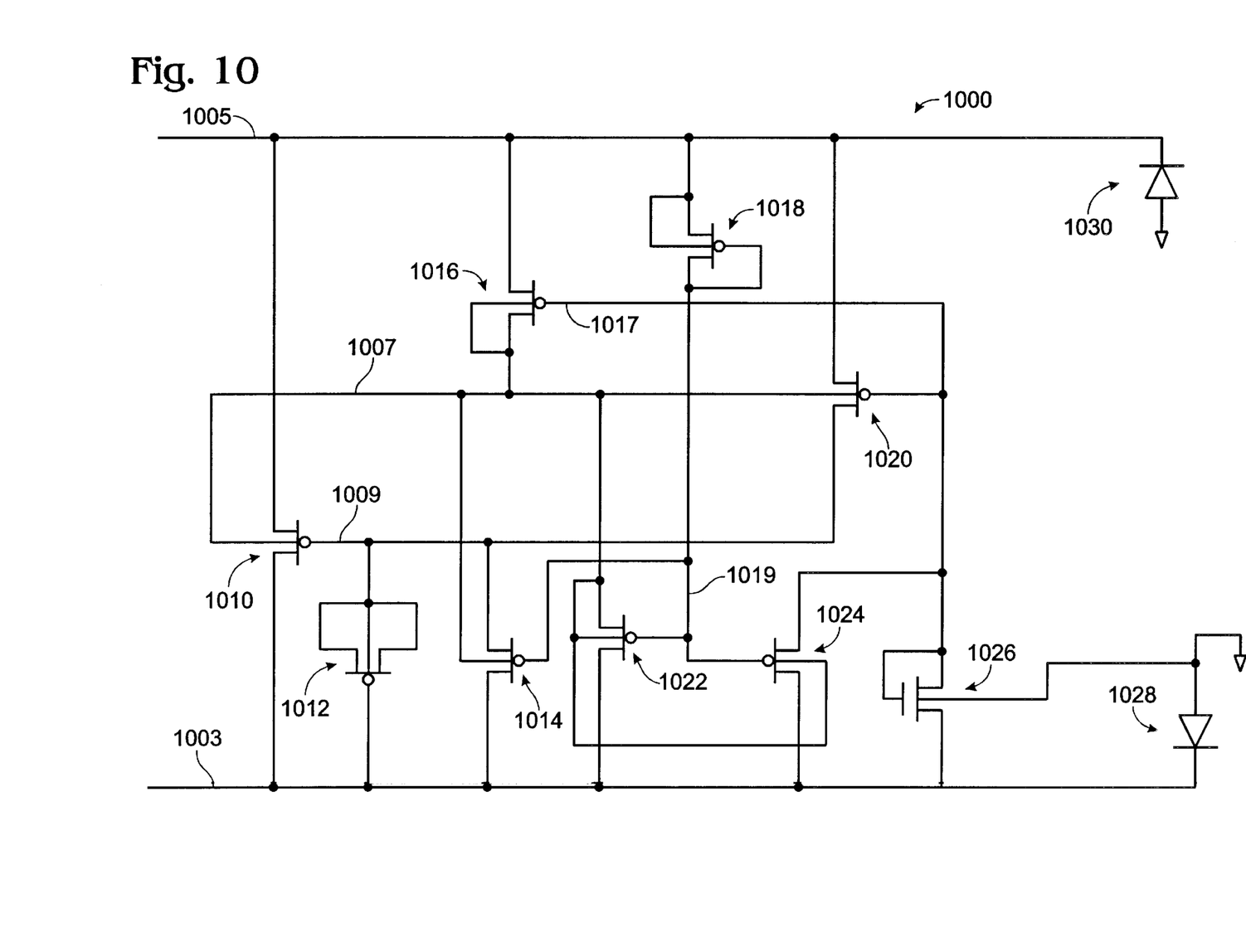
FIG. 10 is a schematic diagram of a bridging clamp circuit.

Referring to FIG. 10, an illustrative embodiment of a PMOS bridge clamp in accordance with the present invention is described. This illustrative embodiment shown in FIG. 10 more fully disables the possible steady state leakage paths than the implementation shown in FIG. 9. Unlike typical CMOS logic circuits where it is understood that an NFET substrate terminal is coupled to ground and a PFET n-well terminal is coupled to the positive supply voltage, implementations of the ESD protection circuits in accordance with the present invention, require careful attention to the voltages applied to the n-well terminals.

A PFET 1010 is coupled source-to-drain between a first power supply node 1003 and a second power supply node 1005. The gate of PFET 1010 is coupled to a node 1009, and its n-well terminal is coupled to a node 1007. A PFET 1012, configured as a two terminal capacitor is coupled between node 1009 and node 1003. The n-well terminal of PFET 1012 is also coupled to node 1009. A PFET 1014 is coupled source-to-drain between node 1009 and node 1003, its n-well terminal is coupled to node 1007, and its gate terminal is coupled to a node 1019. A PFET 1016 is coupled source-to-drain between node 1005 and node 1007, and its n-well terminal is also coupled to node 1007. A PFET 1018 is coupled source-to-drain between node 1005 and node 1019, its gate terminal is coupled to node 1019, and its n-well terminal is coupled to node 1005. A PFET 1020 is coupled source-to-drain between node 1005 and node 1009, its gate terminal is coupled to node 1017, and its n-well terminal is coupled to node 1007. A PFET 1022 is coupled source-to-drain between node 1007 and node 1003, its gate terminal is coupled to node 1019, and its n-well terminal is coupled to node 1007. A PFET 1024 is coupled source-to-drain between node 1017 and 1003, its gate terminal is coupled to node 1019, and its n-well terminal is coupled to node 1007. An NFET 1026 is coupled drain-to-source between node 1017 and node 1003. The combination of PFET 1024 and NFET 1026 amounts to a resistive connection from node 1003 to node 1017, regardless of the polarity of the voltage between nodes 1003 and 1005, and may possibly be replaced by a resistor. Reverse biased diodes 1028 and 1030, which can take the form of guard rings, are coupled respectively to nodes 1003 and 1005 as shown.

For the normal case of a positive ESD zap applied to node 1005, with node 1003 floating or at ground, PFET 1010 has its n-well node 1007 pulled up to 1005 through PFET 1016, whose gate is held low by NFET. Meanwhile, 1010's gate 1009 is held near 1003 by capacitor 1012, which gradually charges up to 1005 through long-channel resistive PFET 1020. Thus 1010 is heavily on and ESD current can be passed from 1005 to 1003, as intended, for a time set by the RC timer 1020 and 1012, usually microseconds. However conduction shuts off after that delay, and the delays of milliseconds or longer in the operational power-up of different voltage supplies will be largely unaffected.

If a positive ESD zap were applied to node 1003, or if node 1003 were powered up ahead of node 1005 during component operation, then the voltage at node 1003 could be higher than the voltage at node 1005. In such a case, it is desirable to block conduction from node 1003 to node 1005, because node 1003 is better protected for withstanding an ESD event. To achieve the current blocking mentioned above PFET 1018 keeps node 1019 low so that PFETs 1014, 1022 and 1024 are all on, thus pulling node 1009 (which includes the gate of large PFET 1010), floating n-well 1007, and node 1017, respectively, to the voltage at node 1003. This shuts off substantially all conduction through large PFET 1010 and the bias circuitry, such that only subthreshold levels of conduction would typically exist. Thus the PMOS bridge embodiment shown in FIG. 10 achieves reverse direction current blockage (i.e., from node 1003 to node 1005), thereby reducing constraints with respect to power-up sequencing that would otherwise typically be imposed on device usage.

The illustrative embodiment of a PMOS bridge shown in FIG. 10 achieves low leakage in steady state with high voltage on node 1005 and core voltage on node 1003, by virtue of using an applied core voltage for a reference, thereby eliminating the need to set up an internal reference with voltage dividers as shown in the illustrative embodiment of FIG. 8. Typical standby leakage currents in the illustrative embodiments shown in FIGS. 9–10 are in the low nanoamps or less (resulting from junction and subthreshold leakage).

The circuits in FIGS. 9 and 10 do not make use of inverters and extra capacitors for gate drive enhancement, as described earlier for the PMOS clamp in FIG. 7. However, such techniques could be employed here also, if two inverters (ratioed according to the principles described in connection with the FIG. 7 implementation) are connected between the RC timer and the gate of PFET 1010. In such a configuration, the inverters would be connected between node 1007 (i.e., floating n-well) and node 1003 in order to retain the functionality of blocked conduction in reverse mode as discussed above. In reverse mode the inverters would be tied off as node 1007 is electrically connected to node 1003. An additional capacitor between node 1009 and node 1003 typically helps to enhance the gate drive provided to PFET 1010.

Conclusion

The present invention provides an area efficient ESD protection circuit for power supplies on low voltage CMOS processes.

Some advantages of ESD protection circuits in accordance with the present invention are fast action, non-destructiveness, and scalability with respect to gate dielectric breakdown voltages.

The present invention may be implemented with various changes and substitutions to the illustrated embodiments. For example, capacitors shown as implemented with PFETs or NFETs might also be implemented with other capacitor structures that can be fabricated in microelectronic manufacturing processes such as metal-to-metal, polysilicon-to-polysilicon, or metal-to-polysilicon capacitors.

It will be readily understood by those skilled in the art that various other changes in the details, materials, and arrangements of the parts and steps which have been described and illustrated in order to explain the nature of this invention may be made without departing from the principles and scope of the invention as expressed in the subjoined claims.

What is claimed is:

1. An electrostatic discharge (ESD) protection circuit comprising:
    an electrically conductive element coupled between an ESD source and a first node, the electrically conductive element having a control input terminal;
    a discharge path control circuit having an output terminal coupled to the control input terminal of the electrically conductive element; and
    an RC timer having an output terminal coupled to the input terminal of the discharge path control circuit wherein the discharge path control circuit comprises a first inverting circuit stage having an input terminal and an output terminal; and
    a second inverting circuit stage having an output terminal, and an input terminal coupled to the output terminal of the first inverting circuit stage.

2. The circuit of claim 1, wherein the discharge path control circuit further comprises a capacitor coupled in series between the output terminal of the second inverting circuit stage and ground.

3. The circuit of claim 2, wherein the capacitor comprises at least one FET.

4. The circuit of claim 1, wherein the first inverting circuit stage is an inverter having a first trip point.

5. The circuit of claim 4, wherein the second inverting circuit stage is an inverter having a second trip point and the first trip point and second trip point are different.

6. The circuit of claim 1, wherein the RC timer circuit comprises a capacitor coupled in series with an electrically conductive element.

7. The circuit of claim 6, wherein the capacitor coupled to the electrically conductive element comprises at least one FET.

8. The circuit of claim 6, wherein the electrically conductive element comprises at least one FET.

9. An ESD protection circuit comprising:
    a switchable conductive circuit coupled between an ESD source and a first node, the switchable conductive circuit having at least two control input terminals;

a control circuit having at least a first output terminal coupled to a first one of the at least two control input terminals of the switchable conductive circuit;

a timer circuit having an output terminal coupled to the control circuit; and a voltage divider having an output terminal coupled to the timer circuit and a second one of the at least two control input terminals of the switchable conductive circuit.

10. The circuit of claim 9, wherein the switchable conductive circuit comprises two series coupled PFETs, and the first node is ground.

11. The circuit of claim 10, wherein the two series coupled PFETs each have body terminals electrically coupled to a common node.

12. The circuit of claim 11, wherein the two series coupled PFETs are formed in a single well.

13. A bridge clamp circuit comprising:

a first electrically conductive element having at least a first and a second control terminal, and two input/output (I/O) terminals;

an RC timer having an output terminal coupled to the first control terminal; and a control circuit having an output terminal coupled to the second control terminal;

wherein the electrically conductive element is a first PFET having a gate, a source, a drain, and a body terminal, the first control terminal is the gate of the PFET, the second control terminal is the body terminal of the first PFET and the I/O terminals are the source and drain terminals of the first PFET and wherein the control circuit comprises a second PFET having a gate, a source, a drain, and a body terminal, wherein the source terminal of the second PFET is coupled to the source terminal of the first PFET, the body and the drain terminal of the second PFET are coupled to the body terminal of the first PFET, and the gate terminal of the second PFET is coupled to a bias circuit.

14. The bridge clamp of claim 13, wherein the control circuit further comprises:

a third PFET having a source terminal and a body terminal both coupled to the first I/O terminal, and a gate terminal and a drain terminal coupled to each other;

a fourth PFET having a source terminal coupled to the gate of the first PFET, a gate terminal coupled to the gate terminal of the third PFET, a drain terminal coupled to the second I/O terminal, and a body terminal coupled the body terminal of the first PFET, and a fifth PFET, having a source terminal and a substrate terminal both coupled to the body terminal of the first PFET, a gate terminal coupled to the gate terminal of the fourth PFET, and a drain terminal coupled to the second I/O terminal.

15. The bridge clamp of claim 14, wherein the control circuit further comprises:

a sixth PFET, having a gate coupled to the gates of the fourth and fifth PFETs, a source coupled to the gate of the second PFET, a drain coupled to the second I/O terminal, and a body terminal coupled to the body terminal of the first PFET; and an NFET having a gate and a drain both coupled to the source of the sixth PFET and having a source terminal coupled to the second I/O terminal.

16. The bridge clamp of claim 14, wherein the control circuit further comprises:

a resistor coupled between the gate of the second PFET and the second I/O terminal.

17. The bridge clamp of claim 14, wherein the RC timer comprises:

a second electrically conductive element coupled between the first I/O terminal and the gate of the first PFET; and a capacitor coupled between the gate of the first PFET and the second I/O terminal.

18. The bridge clamp of claim 17, wherein capacitor comprises a FET.

19. An ESD protection network for integrated circuits having at least two power supply nodes, the network comprising:

a first power supply node, a second power supply node, and a third node;

an ESD protection circuit coupled between the second power supply node and the third node; and a bridge clamp coupled between the first power supply node and the second power supply node wherein the ESD protection circuit comprises an electrically conductive element coupled between an ESD source and the third node, the electrically conductive element having a control input terminal;

a discharge path control circuit having an output terminal coupled to the control input terminal of the electrically conductive element; and an RC timer having an output terminal coupled to the input terminal of the discharge path control circuit.

20. The circuit of claim 19, wherein the ESD protection circuit comprises:

a switchable conductive circuit coupled between an ESD source and a first node, the switchable conductive circuit having at least two control input terminals;

a control circuit having at least a first output terminal coupled to a first one of the at least two control input terminals of the switchable conductive circuit;

a timer circuit having an output terminal coupled to the control circuit; and a voltage divider having an output terminal coupled to the timer circuit and a second one of the at least two control input terminals of the switchable conductive circuit.

21. The circuit of claim 19, wherein the discharge path control circuit comprises:

a first inverting circuit stage having an input terminal and an output terminal; and a second inverting circuit stage having an output terminal, and an input terminal coupled to the output terminal of the first inverting circuit.

22. The circuit of claim 21, wherein the discharge path control circuit further comprises a capacitor coupled in series between the output terminal of the second inverting circuit stage and the third node.

* * * * *